(12) United States Patent
Akselrod et al.

(10) Patent No.: US 10,790,324 B2
(45) Date of Patent: Sep. 29, 2020

(54) CONTROL CIRCUITRY FOR 2D OPTICAL METASURFACES

(71) Applicant: Elwha LLC, Bellevue, WA (US)

(72) Inventors: Gleb M. Akselrod, Bellevue, WA (US); Erik E. Josberger, Seattle, WA (US); Mark C. Weidman, Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

(21) Appl. No.: 16/675,030

(22) Filed: Nov. 5, 2019

(65) Prior Publication Data

US 2020/0203413 A1    Jun. 25, 2020

Related U.S. Application Data

(63) Continuation of application No. 15/824,893, filed on Nov. 28, 2017, now Pat. No. 10,468,447.

(Continued)

(51) Int. Cl.
*H01L 21/00* (2006.01)
*H01L 27/146* (2006.01)
(Continued)

(52) U.S. Cl.
CPC .. *H01L 27/14625* (2013.01); *B29D 11/00326* (2013.01); *B82Y 20/00* (2013.01); *G01S 7/4813* (2013.01); *G01S 7/4817* (2013.01); *G01S 17/10* (2013.01); *G01S 17/42* (2013.01); *G01S 17/89* (2013.01); *G02B 5/1809* (2013.01); *G02F 1/0107* (2013.01); *G02F 1/1339* (2013.01);
(Continued)

(58) Field of Classification Search
CPC ........ H01L 27/14625; H01L 27/14643; B29D 11/00326; B82Y 20/00; G01S 7/4813; G01S 7/4817; G01S 7/10; G01S 7/42; G01S 7/89; G02B 5/1809; G02F 1/0107; G02F 1/1339; G02F 1/1341; G02F 1/292; G03H 1/00; G03H 1/0244; G03H 1/0433; H01J 37/3174; H01J 37/32816; H01Q 1/38; H01Q 3/44; H01Q 5/02; H01Q 5/148; H01Q 5/2253; H04N 5/374
See application file for complete search history.

(56) References Cited

U.S. PATENT DOCUMENTS 9,040,428 B2    5/2015  Hong et al.
10,303,038 B2   5/2019  Kim et al.
(Continued)

FOREIGN PATENT DOCUMENTS

CN    103259097 A    8/2013

OTHER PUBLICATIONS

Y. Huang et al., "Gate-tunable conducting oxide metasurfaces," Nano Lett. 16, 5319 (2016).
(Continued)

*Primary Examiner* — Richard A Booth

(57) ABSTRACT

A 2D hologram system with a matrix addressing scheme is provided. The system may include a 2D array of sub-wavelength hologram elements integrated with a refractive index tunable core material on a wafer substrate. The system may also include a matrix addressing scheme coupled to the 2D array of sub-wavelength hologram elements and configured to independently control each of the sub-wavelength hologram elements by applying a voltage.

6 Claims, 6 Drawing Sheets

Related U.S. Application Data

(60) Provisional application No. 62/462,105, filed on Feb. 22, 2017.

(51) Int. Cl.

| | |
|---|---|
| *H01J 37/32* | (2006.01) |
| *H01J 37/317* | (2006.01) |
| *G02F 1/1341* | (2006.01) |
| *G02F 1/1339* | (2006.01) |
| *G02F 1/01* | (2006.01) |
| *G01S 17/89* | (2020.01) |
| *G01S 17/42* | (2006.01) |
| *G01S 17/10* | (2020.01) |
| *G01S 7/481* | (2006.01) |
| *H01Q 15/14* | (2006.01) |
| *H01Q 15/02* | (2006.01) |
| *H01Q 15/00* | (2006.01) |
| *H01Q 3/44* | (2006.01) |
| *H01Q 1/38* | (2006.01) |
| *G03H 1/02* | (2006.01) |
| *B82Y 20/00* | (2011.01) |
| *B29D 11/00* | (2006.01) |
| *H04N 5/374* | (2011.01) |
| *H04N 5/225* | (2006.01) |
| *G03H 1/04* | (2006.01) |
| *G02B 5/18* | (2006.01) |
| *G02F 1/29* | (2006.01) |
| *G03H 1/00* | (2006.01) |
| *G02F 1/1334* | (2006.01) |
| *G03F 7/20* | (2006.01) |

(52) U.S. Cl.
CPC ............ *G02F 1/1341* (2013.01); *G02F 1/292* (2013.01); *G03H 1/00* (2013.01); *G03H 1/0244* (2013.01); *G03H 1/0443* (2013.01); *H01J 37/3174* (2013.01); *H01J 37/32816* (2013.01); *H01L 27/14643* (2013.01); *H01Q 1/38* (2013.01); *H01Q 3/44* (2013.01); *H01Q 15/002* (2013.01); *H01Q 15/0066* (2013.01); *H01Q 15/02* (2013.01); *H01Q 15/148* (2013.01); *H04N 5/2253* (2013.01); *H04N 5/374* (2013.01); *G02F 1/13342* (2013.01); *G02F 2202/103* (2013.01); *G02F 2202/30* (2013.01); *G02F 2202/36* (2013.01); *G03F 7/2041* (2013.01); *G03F 7/2059* (2013.01); *G03H 2240/13* (2013.01); *H01J 2237/334* (2013.01)

(56) References Cited

U.S. PATENT DOCUMENTS

| | | |
|---|---|---|
| 2001/0028483 A1 | 10/2001 | Buse |
| 2002/0081445 A1 | 6/2002 | Kadomura et al. |
| 2003/0174940 A1 | 9/2003 | Charlton et al. |
| 2004/0125266 A1 | 7/2004 | Miyauchi et al. |
| 2005/0117866 A1 | 6/2005 | Park et al. |
| 2005/0247866 A1 | 11/2005 | Plewa et al. |
| 2006/0202125 A1 | 9/2006 | Suhami |
| 2006/0284187 A1 | 12/2006 | Wierer, Jr. et al. |
| 2007/0013983 A1* | 1/2007 | Kitamura ............ G03H 1/0244 1/244 |
| 2008/0128774 A1 | 6/2008 | Irani et al. |
| 2009/0169866 A1 | 7/2009 | Ostafin et al. |
| 2010/0075262 A1 | 3/2010 | Koefer et al. |
| 2010/0276665 A1 | 11/2010 | Wang |
| 2011/0134496 A1* | 6/2011 | Tompkin ............ G03H 1/28 359/2 |
| 2011/0244613 A1 | 10/2011 | Heck et al. |
| 2012/0194399 A1 | 8/2012 | Bily et al. |
| 2012/0267694 A1 | 10/2012 | Kaiser et al. |
| 2014/0038320 A1 | 2/2014 | Wang |
| 2014/0266946 A1 | 9/2014 | Bily et al. |
| 2015/0036198 A1* | 2/2015 | Inokuchi ............ B42D 25/24 359/2 |
| 2015/0162658 A1 | 6/2015 | Bowers et al. |
| 2015/0318618 A1 | 11/2015 | Chen et al. |
| 2015/0318620 A1 | 11/2015 | Black et al. |
| 2015/0372389 A1 | 12/2015 | Chen et al. |
| 2015/0380828 A1 | 12/2015 | Black et al. |
| 2016/0303879 A1 | 10/2016 | Yamada et al. |
| 2016/0320531 A1 | 11/2016 | Kamali et al. |
| 2016/0370568 A1 | 12/2016 | Toussaint et al. |
| 2017/0047312 A1 | 2/2017 | Budd et al. |
| 2017/0153528 A1 | 6/2017 | Kim et al. |
| 2017/0171540 A1 | 6/2017 | Li et al. |
| 2017/0212285 A1 | 7/2017 | Arbabi et al. |
| 2018/0047774 A1 | 2/2018 | Garreau et al. |
| 2018/0239213 A1 | 8/2018 | Akselrod et al. |
| 2019/0006533 A1 | 1/2019 | Goldan et al. |
| 2019/0294104 A1* | 9/2019 | Rho ............ G03H 1/2205 |
| 2019/0377084 A1 | 12/2019 | Sleasman et al. |

OTHER PUBLICATIONS

A. Pors, S.I. Bozhevolnyi, "Plasmonic metasurfaces for efficient phase control in reflection," Opt. Express 21, 27438 (2013).
A. Arbabi, Y. Horie, A.J. Ball, M. Bagheri, A. Faraon, "Subwavelength-thick lenses with high numerical apertures and large efficiency based on high contrast transmitarrays," Nat. Commun. 6, 1 (2014).
C. Haffner et al., "All-plasmonic Mach-Zehnder modulator enabling optical high-speed communication at the microscale." Nat. Photonics 9, 525-528 (2015).
M. Li et al., "Poling efficiency enhancement of tethered binary nonlinear optical chromophores for achieving an ultrahigh n3r33 figure-of-merit of 2601 pm V?1" J. Mater. Chem. C 3, 6737-6744 (2015).
X. Zhang et al., "High performance optical modulator based on electro-optic polymer filled silicon slot photonic crystal waveguide," J. Light. Technol. 34, 2941-2951 (2016).
Y. Xing et al., "Digitally controlled phase shifter using an SOI slot waveguide with liquid crystal infiltration," 27, 1269-1272 (2015.).
V. Borshch, S.V. Shiyanovskii, O.C. Lavrentovich, "Nanosecond electro-optic switching of a liquid crystal," Phys. Rev. Lett. 111, 107802 (2013).
H. Chen et al., "Ultra-low viscosity liquid crystal materials," Opt. Mater. Express 5, 655 (2015).
B. Gholipour, J. Zhang, K.F. MacDonald, DW. Hewak, N.I. Zheludev, "An all-optical, non-volatile, bidirectional, phase-change meta-switch," Adv. Mater. 25, 3050 (2013).
S. Raoux, F. Xiong, M. Wuttig, E. Pop, "Phase change materials and phase change memory," MRS Bull. 39, 703 (2014).
C. Ríos, et al., "Integrated all-photonic non-volatile multi-level memory," Nat. Photonics 9, 725 (2015).
Arbabi et al.; "Dielectric metasurfaces for complete control of phase and polarization with subwavelength spatial resolution and high transmission"; Nature Nanotechnology; Aug. 31, 2015; pp. 937-943; vol. 10; Macmillan Publishers Limited.
PCT International Search Report; International App. No. PCT/US2018/019269; dated Jun. 4, 2018; pp. 1-4.
Arbabi et al.; "Dielectric metasurfaces for complete control of phase and polarization with subwavelength spatial resolution and high transmission"; Nature Nanotechnology 2015; pp. 1-9; Macmillan Publishers Limited.
PCT International Search Report; International App. No. PCT/US2018/019036; dated Jun. 11, 2018; pp. 1-3.

\* cited by examiner

CONTROL CIRCUITRY FOR 2D OPTICAL METASURFACES

CROSS-REFERENCE TO RELATED PATENT APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC § 119(e) for provisional patent applications, for any and all parent, grandparent, great-grandparent, etc. applications of the Priority Application(s)).

Priority Applications

This patent application is a continuation of U.S. patent application Ser. No. 15/824,893, entitled "Control Circuitry for 2D Optical Metasurfaces," filed on Nov. 28, 2017, which claims the benefit of U.S. Provisional Patent Application No. 62/462,105, entitled "Optical Surface Scattering Antennas," filed on Feb. 22, 2017 under 35 U.S.C. § 119(e), both of which are incorporated herein by reference in their entireties.

This patent application relates to U.S. patent application Ser. No. 15/799,654, entitled "Fabrication of Optical Metasurfaces," filed on Oct. 31, 2017, which is incorporated herein by reference in its entirety.

This patent application also relates to U.S. patent application Ser. No. 15/824,189, entitled "Control Circuitry for 1D Optical Metasurfaces," filed on Nov. 28, 2017, which is incorporated herein by reference in its entirety.

This patent application further relates to U.S. patent application Ser. No. 15/790,337, entitled "LIDAR Scanning System," filed on Oct. 23, 2017, which is incorporated herein by reference in its entirety.

If an Application Data Sheet (ADS) has been filed on the filing date of this application, it is incorporated by reference herein. Any applications claimed on the ADS for priority under 35 U.S.C. §§ 119, 120, 121, or 365(c), and any and all parent, grandparent, great-grandparent, etc., applications of such applications are also incorporated by reference, including any priority claims made in those applications and any material incorporated by reference, to the extent such subject matter is not inconsistent herewith.

FIELD

The disclosure is directed to control circuitry or addressing schemes for 2D optical metasurfaces including a 2D array of hologram elements. In particular, the disclosure is directed to a hologram system including an active matrix addressing scheme or a passive matrix addressing scheme, depending upon the type of tunable core material used in the 2D optical metasurfaces. The disclosure also provides methods for operating the hologram systems. The disclosure also includes methods for fabricating the hologram system including a matrix control circuitry.

BACKGROUND

Autonomous systems, such as vehicles, drones, robotics, security, mapping, among others, need to view the world in 3D. Scanning Light Detection and Ranging (Lidar) is the 3D sensor for self-driving cars. The current Lidar is unreliable, bulky and high cost. Lidar can also be used to make high-resolution maps and provides dynamic field of view.

Solid state Lidar uses chips and does not include moving parts and thus has high reliability. The solid state Lidar also uses low power, and small packages, and is able to use low cost complementary metal-oxide-semiconductor (CMOS) fabrication technique. The solid state Lidar can have mass production. However, there still remains a need to develop techniques to produce solid-state Lidar.

BRIEF SUMMARY

In an embodiment, a 2D hologram system with a matrix addressing scheme is provided. The system may include a 2D array of sub-wavelength hologram elements integrated with a refractive index tunable core material on a wafer substrate. The system may also include a matrix addressing scheme coupled to the 2D array of sub-wavelength hologram elements and configured to independently control each of the sub-wavelength hologram elements by applying a voltage.

In an embodiment, a method is provided for operating a 2D hologram system having a 2D array of hologram elements with a matrix addressing scheme. The method may include adjusting a binary voltage on a first row to change the first row from an "off" state to an "on" state. The method may also include applying a first analog voltage to a first column such that the first analog voltage is stored in a first hologram element in the first column and the first row. The method may further include changing the first row to an "off" state and adjusting a second row from an "off" state to an "on" state. The method may also include applying a second analog voltage to a second column such that the second analog voltage is stored in a second hologram element in the second column and the second row. Each of the 2D array of sub-wavelength hologram elements is integrated with a refractive index tunable core material on a wafer substrate comprising a matrix control circuitry having a 2D array of CMOS transistors.

In an embodiment, a method is provided for operating a hologram system having a 2D array of sub-wavelength hologram elements, with a passive matrix addressing scheme. The method may include applying a first analog voltage to a first ROW line, wherein a first row of a 2D array of sub-wavelength hologram elements is coupled to the first ROW line. The method may also include applying a second analog voltage to a first COLUMN line. A first column of the 2D array of sub-wavelength hologram elements is coupled to the first COLUMN line. The method may further include applying a third analog voltage to the first ROW line or to the first COLUMN line in a refreshing time shorter than a relaxation time of a refractive index tunable core material integrated with a pair of dielectric pillars of each of the 2D array of sub-wavelength hologram elements. A first hologram element in the first row and the first column has a first total analog voltage equal to a sum of the first analog voltage and the second analog voltage. A second total analog voltage is equal to the sum of the third analog voltage and the first or second analog voltage. If the second total analog voltage is smaller than the first total analog voltage, the state of the refractive index tunable core material of the first hologram element remains substantially constant, or if the second total analog voltage is greater than the first total analog voltage, the state of the refractive index tunable core material of the first hologram element is changed according to the second total analog voltage.

In an embodiment, a method is provided for fabricating a hologram system having a 2D array of hologram elements with a matrix addressing scheme. The method may include fabricating a matrix control circuitry having a 2D array of CMOS transistors over a wafer and forming metallic interconnects to the matrix control circuitry. The method may also include depositing an oxide layer over the metallic interconnects and planarizing the oxide layer. The method may further include disposing a reflector layer over planarized oxide layer and fabricating a 2D array of sub-wavelength hologram elements over the reflector layer, wherein each of the 2D array of sub-wavelength hologram elements comprises a pair of dielectric pillars integrated with a refractive index tunable core material.

Additional embodiments and features are set forth, in part, in the description that follows, and will become apparent to those skilled in the art upon examination of the specification or may be learned by the practice of the disclosed subject matter. A further understanding of the nature and advantages of the present disclosure may be realized by reference to the remaining portions of the specification and the drawings, which form a part of this disclosure.

BRIEF DESCRIPTION OF THE DRAWINGS

The description will be more fully understood with references to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

The disclosure provides a 2D hologram system having a 2D array of sub-wavelength hologram elements. In some embodiments, the 2D hologram system may include a matrix control circuitry having CMOS layers under a metal reflector layer which is under the 2D array of sub-wavelength hologram elements. The CMOS layers include a plurality of CMOS transistors that are electrically coupled to the respective hologram elements above the metal reflector layer.

The individual addressing of the 2D array of sub-wavelength hologram elements may be achieved with an active matrix addressing scheme or a passive matrix addressing scheme, depending upon the refractive index tunable core material utilized.

The disclosure also provides methods for fabricating the 2D sub-wavelength hologram elements including the matrix control circuitry having the CMOS layers under the 2D array of hologram elements. The hologram elements can be formed over the CMOS layers by using a nano-scale process, while the CMOS layers can be formed using a CMOS process over an underlying silicon wafer. In addition to material compatibility with CMOS processes, the geometry of the hologram elements is configured such that the hologram system can be fabricated monolithically over the matrix control circuitry.

Figure 1:
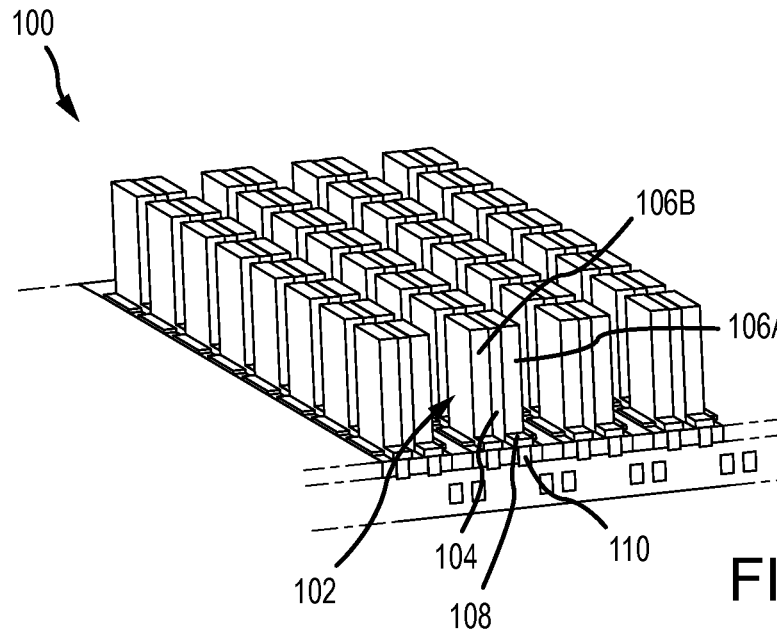
FIG. 1 is a perspective view of a 2D hologram system in accordance with embodiments of the disclosure.

FIG. 1 shows a perspective view of a 2D hologram system in accordance with embodiments of the disclosure. As shown in FIG. 1, a 2D hologram system or a 2D optical metasurface 100 includes a 2D array of hologram elements 102, which includes a pair of dielectric pillars 106A-B and a refractive index tunable core material 104 between the dielectric pillars 106A-B. Each of the dielectric pillars 106A-B extends sideway and has an extension 108 that makes contact with a metal via 110.

In one embodiment, the 2D hologram system 100 may include a matrix control circuitry for actively controlling the hologram elements. The matrix control circuitry may include CMOS layers, which will be described in details below. The hologram system 100 may use an active matrix addressing scheme. In another embodiment, the 2D hologram system 100 does not include the matrix control circuitry. The hologram system 100 may use a passive matrix addressing scheme. In some embodiments, each hologram element is addressed individually or independently.

Matrix Control Circuitry

Figure 2:
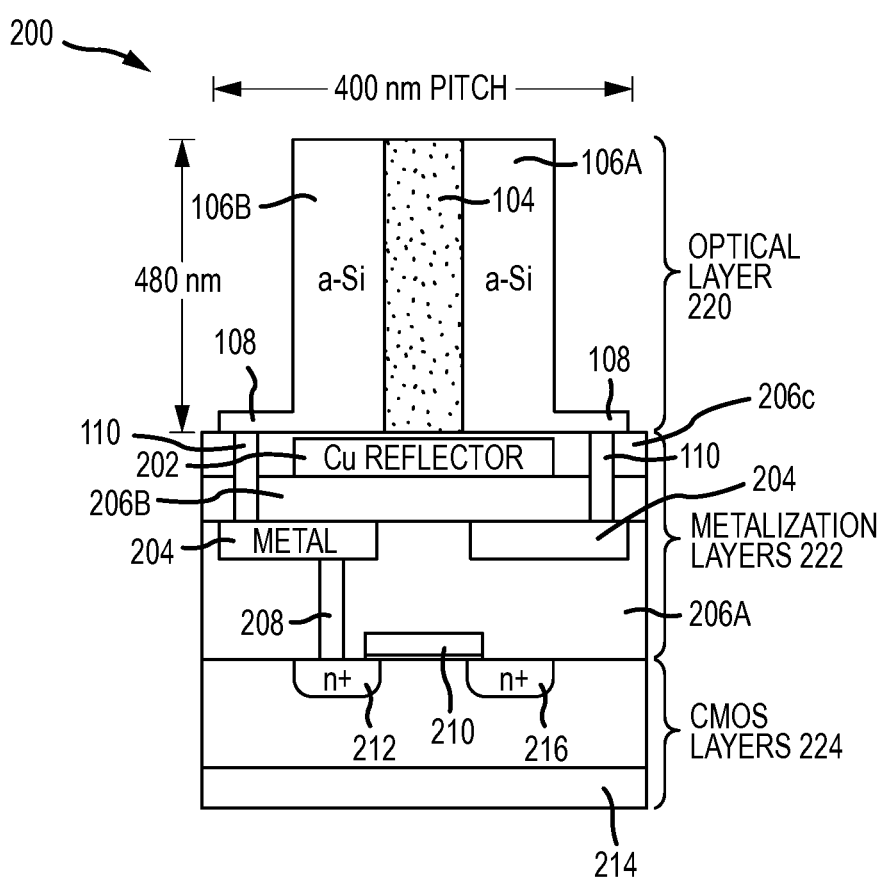
FIG. 2 shows a side view of one sub-wavelength hologram element of the 2D hologram system of FIG. 1 with a matrix control circuitry in accordance with embodiments of the disclosure.

FIG. 2 shows a side view of one sub-wavelength hologram element of a 2D hologram system with a matrix control circuitry in accordance with embodiments of the disclosure. As shown, a 2D hologram system 200 includes optical layers 220 disposed over metallization layers 222, which are deposited over CMOS layers 224 including a silicon wafer 214 at the bottom of the CMOS layers 224.

As shown in FIG. 2, each sub-wavelength hologram element 102 includes a pair of dielectric pillars 106A-B with a gap 104 between the dielectric pillars 106A-B. In one embodiment, the dielectric pillars 106A-B may be amorphous silicon pillars (a-Si). The gap 104 may be filled or integrated with a refractive index tunable core material. In some embodiments, the refractive index tunable core material may include liquid crystals, chalcogenide glasses, and electro-optic (EO) polymers, among others.

The dielectric pillars 106A-B may have side extensions 108 that contact metal vias 110 underneath. The metal vias 110 may extend down from the dielectric pillars to the CMOS layers 224 to couple the CMOS layers 224 to the hologram elements 102 in the optical layer 220. The CMOS layers 224 include a 2D array of CMOS transistors electrically coupled to the dielectric pillars 106A-B of the respective hologram elements 102. Each CMOS transistor includes a Gate 210, a Drain or Source 212, and a Source or Drain 216.

A control voltage is applied across the two dielectric pillars 106A-B. The electric and magnetic energy densities are across the hologram element 102. The dielectric pillars 106A-B are disposed over the third oxide layer 206C, which may include aluminum oxide ($Al_2O_3$), as an etch stop layer.

A metal reflector 202 is positioned under the dielectric pillars 106A-B and above the CMOS layers 224. The oxide layer 206C also surrounds the metal reflector 202. In some embodiments, the metal reflector 202 may be made from copper, aluminum, or other CMOS-compatible metal, without sacrificing performance. The grazing incidence of the incident wave excites magnetic-like Mie resonances in the a-Si pillars with a high Q factor, enabling dynamic modulation of the phase. Additionally, the a-Si pillars are deposited over the metal reflector 202, which makes the structure operate as a reflect-array and thus is possible to integrate with control circuitry. The resonator or hologram element 102 includes two dielectric pillars 106A-B that are separated by the tunable core material 104 having a tunable refractive index. Under the grazing incidence excitation, the electric field is strongly localized in the core between the pillars, while the magnetic field is strongly localized to the entire hologram element including the pillars and the core.

The metallization layers 222 may include upper metal vias 110 that contact the extension 108 of the dielectric pillars 106A-B, and lower metal vias connected to the CMOS transistors. Each of the CMOS transistor may include a Gate 210, a Drain 212, and a Source 216. The metallization layers 222 may also include at least one patterned metal layer 204 that extends sideway, i.e. parallel to the wafer substrate 214. The at least one patterned metal layer 204 connects between the upper metal via 110 and the respective lower metal via 208, which connects to the Drain 212. The Gate 210 is configured to connect to a first external wire such that a voltage can be applied to the Gate 210. The Source 216 is also configured to connect to a second external wire such that a second voltage can be applied to the Source 216.

The metallization layers 222 may also include the reflector layer 202. The reflector layer 202 only extends underneath the gap or core 104 between the dielectric pillars 106A-B of the hologram element 102, where the electric field primarily resides.

As shown, a first oxide layer 206A covers the CMOS layers 224 and lower metal vias 208. The first oxide layer 206A may include $SiO_2$, among others. A second oxide layer 206B covers the metal layer 204 and a lower portion of the upper metal vias 110. The second oxide layer 206B may include silicon oxide ($SiO_2$) among others. The second oxide layer 206 is planarized to provide a nano-scale flatness for the metal reflector layer 202 and sub-wavelength hologram elements 102 in the optical layer 220. A third oxide layer 206C covers the metal reflector layer 202 and an upper portion of the upper metal vias 110. The pillars 106A-B are formed over the third oxide layer 206C and the upper metal vias 110.

In the illustrative embodiment described above, the gap or core 104 between the pillars 106A-B is about 60 nm. Each pillar has a width of about 100 nm and a depth of about 480 nm. The hologram element has a pitch of about 400 nm, which is on a similar scale to the pixel pitch of modern CMOS imaging sensors, which have a typical pixel size of 1000 nm. It will be appreciated by those skilled in the art that these dimensions may vary.

Active Matrix Addressing Scheme

An active matrix addressing scheme uses CMOS transistors to control hologram elements 102, such as metal-oxide-semiconductor field-effect transistors (MOSFETs), to connect a desired analog voltage to one of the hologram elements 102.

The active matrix addressing scheme may be suitable for implementations that use EO polymers, as the EO polymers have an extremely fast response time, such as several femtoseconds, i.e. $10^{-15}$ second. Thus, each hologram element may act as a storage capacitor, which is able to keep the applied analog voltage. The two a-Si pillars may act as electrical conductors of a capacitor, and the tunable core material between the a-Si pillars may act as the dielectric material between the electrical conductors. As such, the hologram element is represented by a capacitor.

Figure 3:
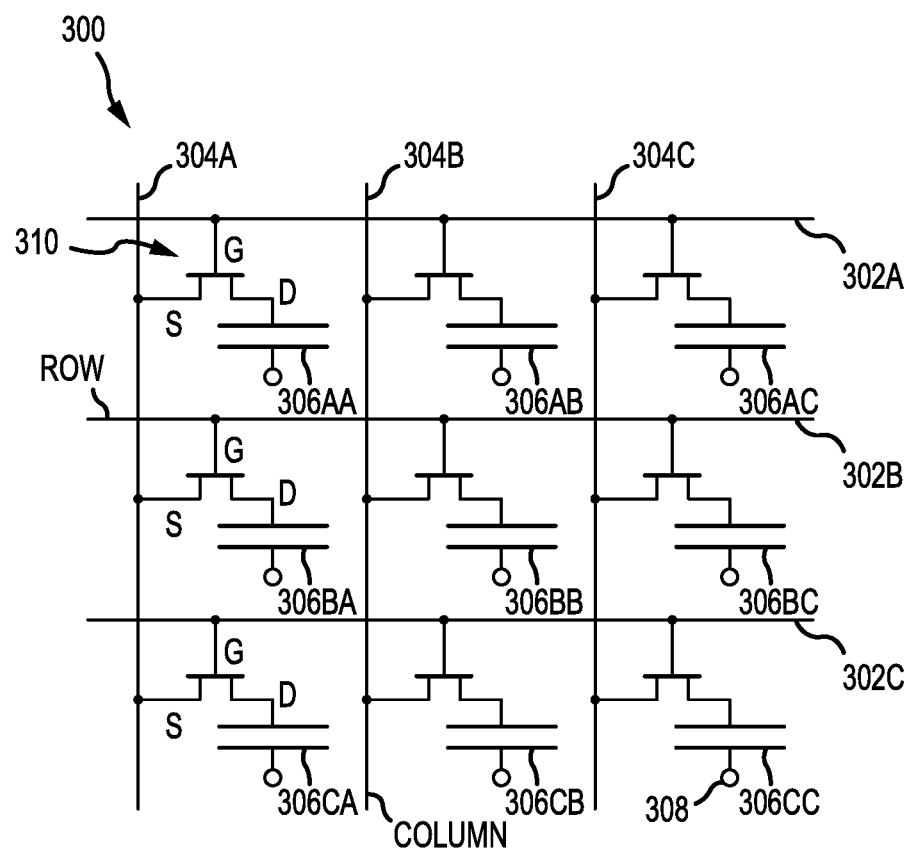
FIG. 3 shows an active matrix addressing scheme for the 2D hologram system of FIG. 1 having the matrix control circuitry of FIG. 2 in accordance with embodiments of the disclosure.

FIG. 3 shows an active matrix addressing scheme for the 2D hologram system of FIG. 1 having a matrix control circuitry of FIG. 2 in accordance with embodiments of the disclosure. As shown, a 2D hologram system includes an array of hologram elements 306 electrically coupled to an array of CMOS transistors 310. The 2D array of hologram elements includes 9 hologram elements 306AA, 306AB, 306AC, 306BA, 306BB, 306BC, 306CA, 306CB, and 306CC, as an example. Each CMOS transistor 310 includes a Gate (G) (e.g. Gate 210) electrically coupled to the respective ROW line 302, a Source (S) (e.g. Source 216) electrically coupled to a respective COLUMN line 304, and a Drain (D) (e.g. Drain 212) electrically coupled to one conductor of a respective capacitor 306. An opposite conductor of the capacitor 306 connects to ground 308.

In the active matrix addressing scheme, the ROW lines 302 are digitally controlled, for example, a binary control, "on" and "off." The COLUMN lines 304 are controlled by analog voltages. The hologram elements 102 act as a capacitor 306. When a ROW line 302 is in an "off" state, the capacitor 306 holds the voltage. The stability of the capacitor 306 depends upon the core material. When the ROW line 302 is in an "on" state, the voltage of the capacitor or hologram element can be changed.

During operation, the digital ROW line 302 activates the Gates of all CMOS transistors, such as MOSFETs, in a specific row. The COLUMN line 304 applies an analog voltage to the hologram elements in a specific column through the Drains of the CMOS transistors 310. When the ROW line 302 changes the CMOS transistors in the specific row to be an "off" state, the capacitors, unit cells, or hologram elements 306 keep the applied analog voltage due to the inherent capacitance of the hologram elements.

As an example, when the ROW line 302A is turned "on," an analog voltage of 2 V, as an example, is applied to a first hologram element 306AA, which is on the first row of and the first column of the 2D array, by applying the analog voltage from the first COLUMN line 304A. The first row of the 2D array is coupled to the first ROW line 302A, while the first column of the 2D array is coupled to the first COLUMN line 304A. Then, the first ROW line 302A is turned "off," such that the first hologram element 306AA has an analog voltage of 2 V.

Next, the second ROW line 302B may be turned "on," and a second analog voltage of 3 V, as an example, may be applied to the second hologram element 306BB, which is on the second row and the second column of the 2D array, by applying the analog voltage from the second COLUMN line 304B. The second row of the 2D array is coupled to the second ROW line 302B, while the second column of the 2D array is coupled to the second COLUMN line 304B. Then, the second ROW line 302B is turned off again, such that the second hologram element 306BB keeps an analog voltage of 3 V. By doing so, each hologram element can be controlled independently in a sequential manner.

It will be appreciated by those skilled in the art that the analog voltage may vary. In some embodiments, the analog voltage may be equal to or greater than −5V. In some embodiments, the analog voltage may be equal to or greater than −4V. In some embodiments, the analog voltage may be equal to or greater than −3V. In some embodiments, the analog voltage may be equal to or greater than −2V. In some embodiments, the analog voltage may be equal to or greater than −1V. In some embodiments, the analog voltage may be equal to or greater than 0V. In some embodiments, the analog voltage may be equal to or greater than 1V. In some embodiments, the analog voltage may be equal to or greater than 2V. In some embodiments, the analog voltage may be equal to or greater than 3V. In some embodiments, the analog voltage may be equal to or greater than 4V.

In some embodiments, the analog voltage may be equal to or less than 5V. In some embodiments, the analog voltage may be equal to or less than 4V. In some embodiments, the analog voltage may be equal to or less than 3V. In some embodiments, the analog voltage may be equal to or less than 2V. In some embodiments, the analog voltage may be equal to or less than 1V. In some embodiments, the analog voltage may be equal to or less than 0V. In some embodiments, the analog voltage may be equal to or less than −1V. In some embodiments, the analog voltage may be equal to or less than −2V. In some embodiments, the analog voltage may be equal to or less than −3V. In some embodiments, the analog voltage may be equal to or less than −4V.

Figure 4:
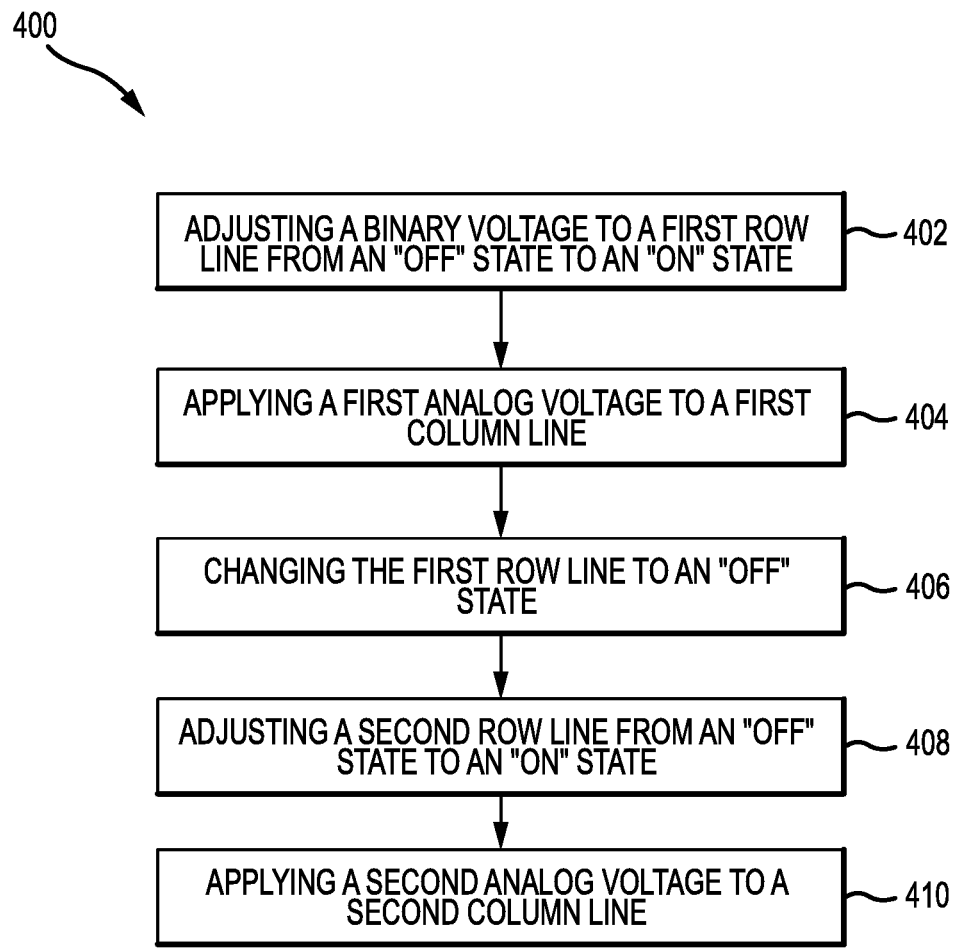
FIG. 4 is a flow chart illustrating the steps for operating the 2D hologram system of FIG. 2 with the active matrix addressing scheme of FIG. 3 in accordance with embodiments of the disclosure.

FIG. 4 is a flow chart illustrating the steps for operating the 2D hologram system of FIG. 2 with the active matrix addressing scheme of FIG. 3 in accordance with embodiments of the disclosure. Operation 400 may include adjusting a binary voltage to a first ROW line from an "off" state to an "on" state at step 402, followed by applying a first analog voltage to a first COLUMN line at step 404. A first hologram element at the first row and the first column of the 2D array now has the first analog voltage. The operation 400 continues with changing the first ROW line to an "off" state at step 406, then adjusting a second ROW line from an "off" state to an "on" state at step 408, and applying a second analog voltage to a second COLUMN line at step 410. A second hologram element at the second row and the second column of the 2D array now has the first analog voltage. With the operation 400, each hologram element can be controlled by an analog voltage independently in a sequential manner.

Passive Matrix Addressing Scheme

In some embodiments, the hologram system uses a passive matrix addressing scheme without a matrix control circuitry. The hologram system is similar to the hologram system disclosed in U.S. patent application Ser. No. 15/799,654, entitled "Fabrication of Optical Metasurfaces," filed on Oct. 31, 2017, which is incorporated herein by reference in its entirety. The manufacturing of this system is much simpler than the hologram system including a matrix control circuitry and the active matrix addressing scheme. The passive matrix addressing scheme does not require the use of MOSFETs in the hologram system and is thus a simpler design than the hologram system with the active matrix addressing scheme. However, the operation of the passive matrix addressing scheme is more complex than the operation of the active matrix addressing scheme, which is described below.

In the passive matrix addressing scheme, the tunable core materials in the hologram elements experience the sum of the analog voltages applied to their ROW and COLUMN lines during all operations, even those targeted for other hologram elements. However, the tunable core material may be most sensitive to the maximum voltage. Therefore, if a refresh rate of the analog voltage is fast enough compared to the relaxation time of the tunable core material, such as liquid crystal, the total average state may be nearly constant.

Figure 5:
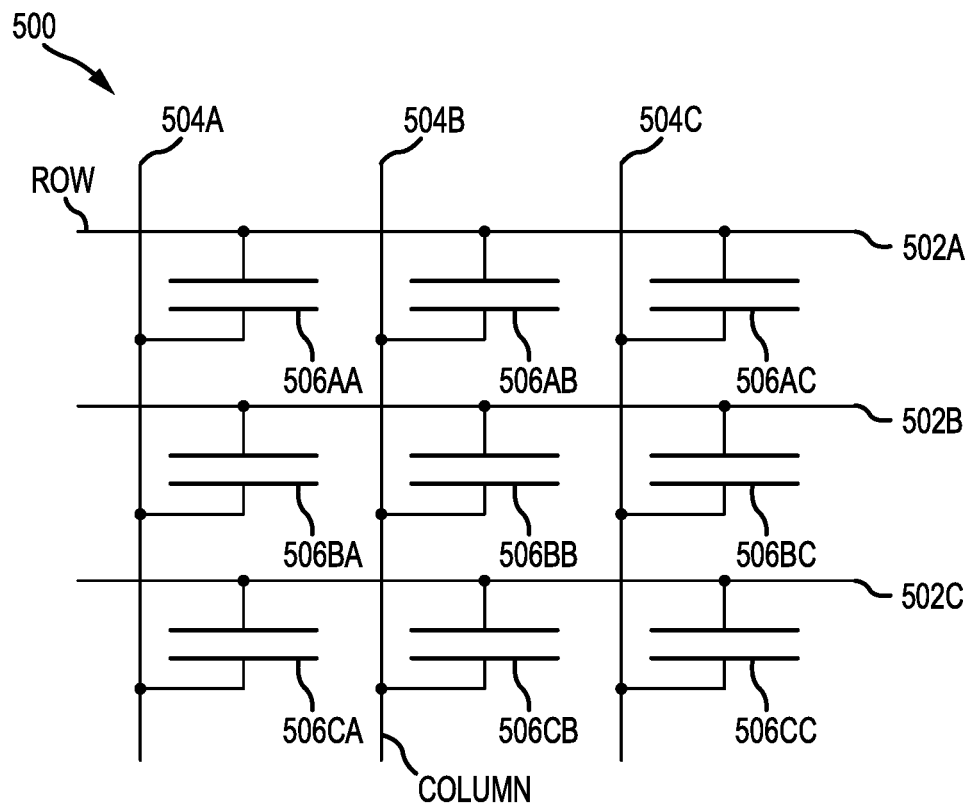
FIG. 5 shows a passive matrix addressing scheme for the 2D hologram system of FIG. 1 without any matrix control circuitry in accordance with embodiments of the disclosure.

FIG. 5 shows a passive matrix addressing scheme for the 2D hologram system of FIG. 1 without any matrix control circuitry in accordance with embodiments of the disclosure. As shown, a 2D array of hologram elements includes 9 hologram elements 506AA, 506AB, 506AC, 506BA, 506BB, 506BC, 506CA, 506CB, and 506CC, as an example. Each row of hologram elements is all coupled to a respective ROW line 502A, 502B, or 502C. Each column of hologram elements of the 2D array is all coupled to a respective COLUMN line 504A, 504B, or 504C. The example is simplified for illustration purposes. The 2D array may be configured such that all the rows may have the same number of hologram elements and all the columns may have the same number of hologram elements. It will be appreciated by one of skilled the art that the number of hologram elements may vary with the array.

The passive matrix addressing scheme for the 2D array of hologram elements is provided below. The hologram elements are sequentially and independently controlled. Each hologram element can be individually switched to a different state. For example, a first hologram element 506AA is on a first row coupled to the first ROW line 502A and a first column coupled to the first COLUMN line 504A. A first analog voltage may be applied to the first ROW line 502A while a second analog voltage may be applied to the first COLUMN line 504A. A first total analog voltage applied to the first hologram element 506AA is the sum of the first analog voltage applied to the ROW line 502A and the second analog voltage applied to the COLUMN line 504A.

In the case of liquid crystals, the passive matrix addressing can be utilized since the molecular orientation has some memory, on the scale of several milliseconds. The passive matrix addressing is also compatible with chalcogenide glasses, since the chalcogenide glasses have a long-term memory. When the tunable core material has a long term memory, such as liquid crystal or chalcogenide glasses, the tunable core material may have a relaxation time significantly longer than a refreshing time of the analog voltage. In other words, the analog voltage can be applied at a high refreshing rate such that the refreshing time is shorter than the relaxation time of the tunable core material. For example, the refresh rate is at least three times faster than the relaxation rate. In one embodiment, the relaxation time may be 1000 times longer than the refreshing time. If the tunable core material has a relaxation time corresponding to a frequency of 30 kHz, the refresh rate for the analog voltage may be is at least 30 MHz.

The state of the first hologram element 506AA is stable until a newly applied total analog voltage exceeds the first total voltage, assuming that the tunable core material has a relaxation time longer than the refreshing time of applying the analog voltage. As an example, a third analog voltage may be applied to the first ROW line 502A or to the first COLUMN line 504A in a refreshing time shorter than a relaxation time of the refractive index tunable core material, which is integrated with a pair of dielectric pillars of each of the 2D array of sub-wavelength hologram elements. Now, a second total analog voltage is equal to the sum of the third analog voltage and the first or second analog voltage. In one embodiment, if the second total analog voltage is smaller than the first total analog voltage, the state of the refractive index tunable core material of the first hologram element 506AA remains substantially constant. In another embodiment, if the second total analog voltage is greater than the first total analog voltage, the state of the refractive index tunable core material of the first hologram element 506AA is changed according to the second total analog voltage.

With respect to a second hologram element 506BB in a second row coupled to the second ROW line 502B and in a second column coupled to the second COLUMN line 504B, a total analog voltage applied to the second hologram element 506BB equals to the sum of the analog voltage on the second ROW line 502B and the second COLUMN line 504B. Likewise, with respect to a third hologram element 506AB in the first row and the second column, a total analog voltage applied to the third hologram element 506AB equals to the sum of the analog voltage on the first ROW line 502A and the second COLUMN line 504B. Similarly, with respect to a fourth hologram element 506BA in the second row and the first column, a total analog voltage applied to the fourth hologram element 506BA equals to the sum of the analog voltage on the second ROW line 502B and the first COLUMN line 504A. As shown by the above examples, each of the hologram elements is individually applied to a total analog voltage.

Figure 6:
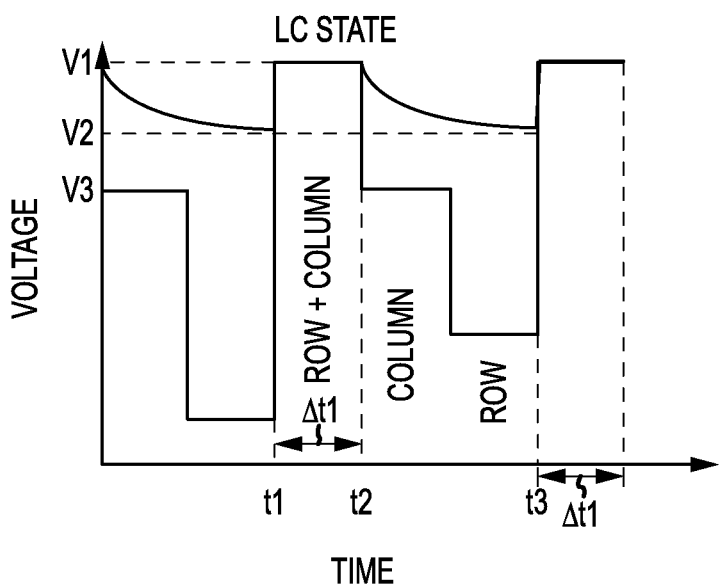
FIG. 6 illustrates a waveform of voltage vs time applied to a hologram element using the passive matrix addressing scheme of FIG. 4 in accordance with embodiments of the disclosure.

FIG. 6 illustrates a waveform of voltage vs time applied to a hologram element using the passive matrix addressing scheme of FIG. 4 in accordance with embodiments of the disclosure. As shown in FIG. 6, the liquid crystal (LC) state is stable at a first voltage $V_1$, such as 5V, equal to a sum of a row voltage applied to a ROW line and a column voltage applied to a COLUMN line for a period of time $\Delta t_1 = t_2 - t_1$. Then, the voltage $V_1$ may decay to a lower voltage $V_2$ during a period of time $\Delta t_2 = t_3 - t_2$. This voltage decay process is referred to relaxation of the liquid crystal. A second voltage $V_1$, such as 5V, is applied at time $t_3$, the LC remains stable for a period of time $\Delta t_1$, and then the voltage $V_1$ may decay again.

It will be appreciated by one of skilled in the art that the liquid crystal may be replaced by any tunable core material that has a long term memory or a long relaxation time.

Figure 7:
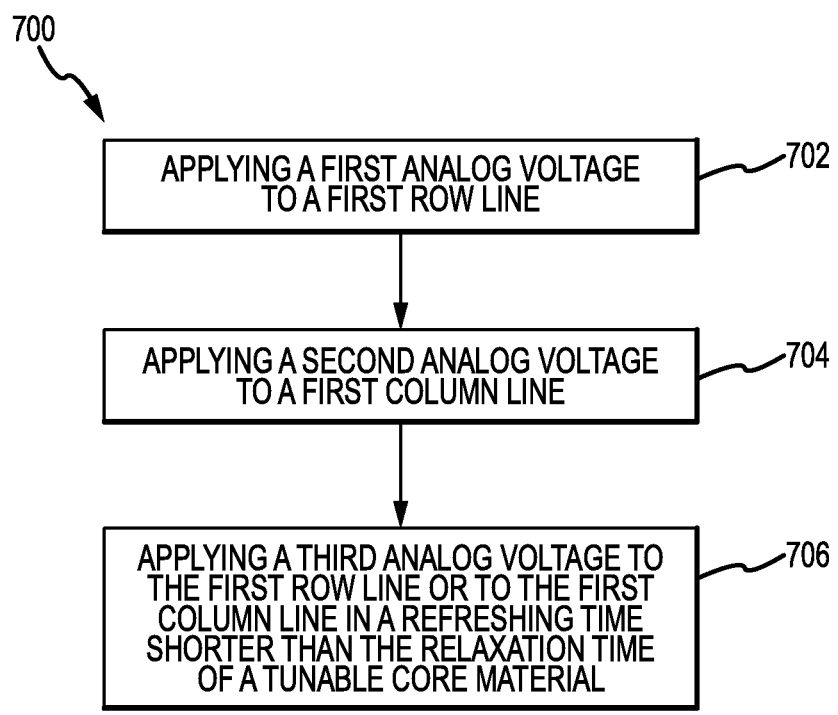
FIG. 7 is a flow chart illustrating the steps for operating the 2D hologram system of FIG. 1 with the passive matrix addressing scheme of FIG. 5 in accordance with embodiments of the disclosure.

FIG. 7 is a flow chart illustrating the steps for operating the 2D hologram system of FIG. 1 with the passive matrix addressing scheme of FIG. 5 in accordance with embodiments of the disclosure. Operation 700 may include applying a first analog voltage to a first ROW line at step 702. The first ROW line is coupled to a first row of a 2D array of sub-wavelength hologram elements.

The operation 700 may also include applying a second analog voltage to a first COLUMN line at step 704. The first COLUMN line is coupled to a first column of the 2D array of sub-wavelength hologram elements. The operation 700 continues with applying a third analog voltage to the first ROW line or the first COLUMN line in a refreshing time shorter than the relaxation time of the tunable core material between the pillars of the hologram element at step 706. The first hologram element in the first row and the first column has a first total analog voltage equal to a sum of the first analog voltage and the second analog voltage. A second total analog voltage is equal to the sum of the third analog voltage and the first or second analog voltage. If the second total analog voltage is smaller than the first total analog voltage, the state of the refractive index tunable core material of the first hologram element remains substantially constant. If the second total analog voltage is greater than the first total analog voltage, the state of the refractive index tunable core material of the first hologram element is changed according to the second total analog voltage.

Fabrication of Hologram System having Matrix Control Circuitry

In some embodiments, the disclosure provides methods for fabricating the 2D hologram system including a matrix control circuitry, suitable for large-scale commercial fabrication. The disclosure provides a process suitable for large-scale commercial fabrication. The dielectric pillars, such as amorphous silicon (a-Si) or poly-crystalline silicon, may be deposited by using plasma-enhanced chemical vapor deposition (PECVD) or CVD.

The nano-scale gaps between the dielectric pillars may be formed by etching using either electron beam lithography, for smaller production volumes (e.g. prototyping), or with deep UV immersion lithography, for large production volumes.

The complementary metal-oxide-semiconductor (CMOS) transistors can be fabricated on a wafer, such as a crystalline silicon wafer. Then, the CMOS transistors can be connected through metal vias to the dielectric pillars for applying a voltage to each pair of pillars, which acts as a capacitor. The metal vias can be planarized with deposition of an oxide layer (e.g. $SiO_2$ deposition), followed by chemical mechanical polishing (CMP) to achieve sub-nanometer surface flatness over the wafer. The CMOS transistors may be metal-oxide-semiconductor field-effect transistors (MOSFETs). The fabrication processes are compatible with CMOS processes.

Figure 8:
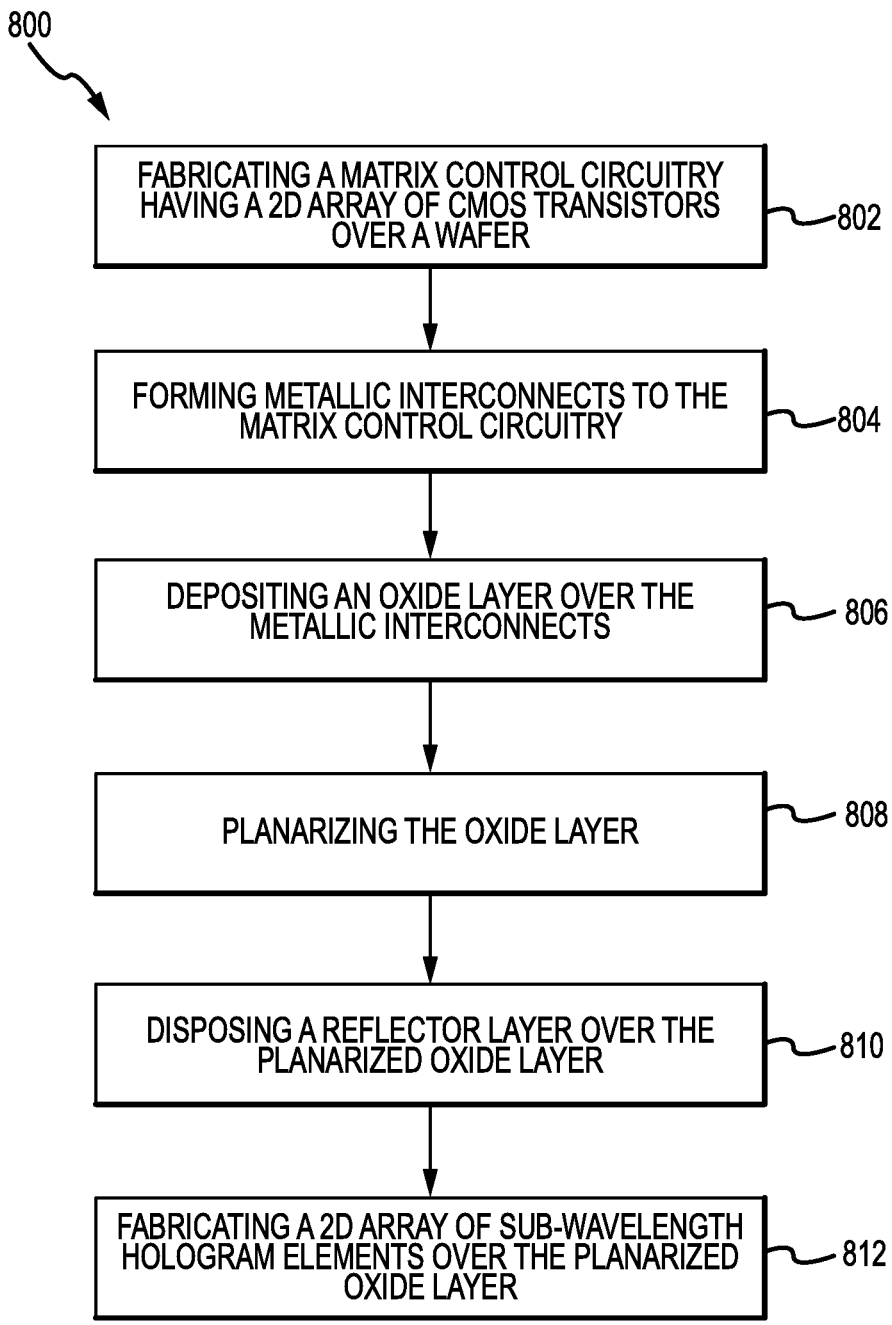
FIG. 8 is a flow chart illustrating the steps for fabricating the hologram system including the active matrix control circuitry of FIG. 3 in accordance with embodiments of the disclosure.

In some embodiments, the fabrication proceeds as follows. FIG. 8 is a flow chart illustrating the steps for fabricating the hologram system including the active matrix control circuitry of FIG. 3 in accordance with embodiments of the disclosure. Process 800 may include fabricating a matrix control circuitry having a 2D array of CMOS transistors over a wafer at step 802. Referring to FIG. 2 again, the CMOS transistors can be first fabricated on the crystalline silicon wafer 214. Then, in a standard CMOS fashion, the CMOS transistors can be connected to the ROW and COLUMN lines of the active matrix addressing scheme by using patterned metallization layers 222.

The process 800 may also include forming metallic interconnects to the matrix control circuitry at step 804. During the metallization step, metal vias 110 in the patterned metallization layers 222, as shown in FIG. 2, are connected to the dielectric pillars 106A-B to control each hologram element 102. The metal vias 110 are also connected to the patterned metal layer 204, which is also referred to a metal interconnect. Lower metal vias 208 are connected between the patterned metal layer 204 and the CMOS transistors in the CMOS layers 224.

The process 800 may be followed by depositing an oxide layer over the metallic interconnects at step 806 and planarizing the oxide layer at step 808. The patterned metal layer 204 and the lower metal vias 208 and lower portion of the upper metal vias 210 can be planarized with an oxide deposition, followed by CMP to achieve sub-nanometer surface flatness. The deposition and planarization processes are also standard CMOS processes.

The process 800 may continue with disposing a reflector layer over the planarized oxide layer at step 810. The metal reflector layer 202 and the dielectric pillars 106A-B, e.g. a-Si pillars, can be fabricated on the planarized matrix control circuitry, as described above, with each dielectric pillar 106A-B connected to the exposed upper metal vias 110. Up to this stage, all fabrication and processes is entirely CMOS compatible.

The process 800 may further include fabricating 1 2D array of sub-wavelength hologram elements over the planarized oxide layer at step 812. The tunable core material can be integrated into the gap 104 between the dielectric pillars. Liquid crystals and EO polymers can be deposited directly via spin coating, and fill the gap via capillary action. The surface may be prepared appropriately to be either hydrophobic or hydrophilic, depending on the tunable core material. In the case of chalcogenide glass, such as $Ge_2Sb_2Te_5$ (GST), sputtering can be employed, followed by a masked wet or dry etch to remove the GST from all areas except inside the core between the pillars.

Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall in between.

What is claimed is:

1. A method of operating a 2D hologram system having a 2D array of hologram elements with a matrix addressing scheme, the method comprising:
   adjusting a binary voltage on a first row to change the first row from an "off" state to an "on" state;
   applying a first analog voltage to a first column such that the first analog voltage is stored in a first hologram element in the first column and the first row;
   changing the first row to an "off" state;
   adjusting a second row from an "off" state to an "on" state;
   applying a second analog voltage to a second column such that the second analog voltage is stored in a second hologram element in the second column and the second row,
   wherein each of the 2D array of sub-wavelength hologram elements is integrated with a refractive index tunable core material on a wafer substrate comprising a matrix control circuitry having a 2D array of CMOS transistors.

2. The method of claim 1, wherein the refractive index tunable core material comprises EP polymer.

3. A method of operating a hologram system having a 2D array of sub-wavelength hologram elements, with a passive matrix addressing scheme, the method comprising:
   applying a first analog voltage to a first ROW line, wherein a first row of a 2D array of sub-wavelength hologram elements is coupled to the first ROW line;
   applying a second analog voltage to a first COLUMN line, wherein a first column of the 2D array of sub-wavelength hologram elements is coupled to the first COLUMN line;
   applying a third analog voltage to the first ROW line or to the first COLUMN line in a refreshing time shorter than a relaxation time of a refractive index tunable core material integrated with a pair of dielectric pillars of each of the 2D array of sub-wavelength hologram elements;
   wherein a first hologram element in the first row and the first column has a first total analog voltage equal to a sum of the first analog voltage and the second analog voltage,
   wherein a second total analog voltage is equal to the sum of the third analog voltage and the first or second analog voltage,
   if the second total analog voltage is smaller than the first total analog voltage, the state of the refractive index tunable core material of the first hologram element remains substantially constant, or
   if the second total analog voltage is greater than the first total analog voltage, the state of the refractive index tunable core material of the first hologram element is changed according to the second total analog voltage.

4. The method of claim 3, further comprising:
   applying a fourth analog voltage to a second ROW line, wherein a second row of the 2D array of sub-wavelength hologram elements is coupled to the second ROW line; and
   applying a fifth analog voltage to a second COLUMN line, wherein a second column of the 2D array of sub-wavelength hologram elements is coupled to the second COLUMN line.

5. The method of claim 3, wherein the second hologram element has a total analog voltage equal to the sum of the fourth analog voltage and the fifth analog voltage, such that the second hologram element is independently controlled from the first hologram element.

6. The method of claim 3, wherein the refractive index tunable core material comprises liquid crystals or chalcogenide glasses.

* * * * *